(12) United States Patent
Hsieh et al.

(10) Patent No.: US 9,897,729 B2
(45) Date of Patent: Feb. 20, 2018

(54) PHOTOSENSITIVE RESIN COMPOSITION FOR COLOR FILTER AND APPLICATION THEREOF

(71) Applicant: CHI MEI CORPORATION, Tainan (TW)

(72) Inventors: Bar-Yuan Hsieh, Taichung (TW); Jung-Pin Hsu, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 319 days.

(21) Appl. No.: 14/687,919

(22) Filed: Apr. 16, 2015

(65) Prior Publication Data

US 2015/0315376 A1  Nov. 5, 2015

(30) Foreign Application Priority Data

Apr. 30, 2014 (TW) .............................. 103115550 A

(51) Int. Cl.

| | |
|---|---|
| *G02B 5/23* | (2006.01) |
| *G02B 5/22* | (2006.01) |
| *C08L 33/14* | (2006.01) |
| *G02B 5/20* | (2006.01) |
| *G03F 7/00* | (2006.01) |
| *G03F 7/027* | (2006.01) |
| *G03F 7/033* | (2006.01) |
| *G03F 7/038* | (2006.01) |
| *G03F 7/075* | (2006.01) |
| *G02F 1/1335* | (2006.01) |

(52) U.S. Cl.
CPC .............. *G02B 5/223* (2013.01); *C08L 33/14* (2013.01); *G02B 5/20* (2013.01); *G03F 7/0007* (2013.01); *G03F 7/027* (2013.01); *G03F 7/033* (2013.01); *G03F 7/038* (2013.01); *G03F 7/0758* (2013.01); *G02F 1/133516* (2013.01)

(58) Field of Classification Search
USPC ......................... 252/586; 430/7, 270.1, 280.1
See application file for complete search history.

(56) References Cited

U.S. PATENT DOCUMENTS

2006/0166114 A1* 7/2006 Lee ....................... G03F 7/0007
430/7

FOREIGN PATENT DOCUMENTS

| TW | 201033737 A | 9/2010 |
| TW | 201226499 A | 7/2012 |
| TW | 201346443 A | 11/2013 |

* cited by examiner

*Primary Examiner* — Monique Peets
(74) *Attorney, Agent, or Firm* — CKC & Partners Co., Ltd.

(57) ABSTRACT

The present invention relates to a photosensitive resin composition for color filter and application thereof. The aforementioned photosensitive resin composition includes an alkali-soluble resin (A), a compound having a vinyl unsaturated group (B), a photo-initiator (C), an organic solvent (D), and a pigment (E). The alkali-soluble resin (A) is obtained by copolymerizing a vinyl unsaturated monomer having a carboxylic group (a1), a vinyl unsaturated monomer having a silane group (a2), a vinyl unsaturated monomer having an oxetanyl group (a3) and an other copolymerizable vinyl unsaturated monomer (a4).

12 Claims, No Drawings

PHOTOSENSITIVE RESIN COMPOSITION FOR COLOR FILTER AND APPLICATION THEREOF

RELATED APPLICATIONS

This application claims priority to Taiwan Application Serial Number 103115550, filed Apr. 30, 2014, which is herein incorporated by reference.

BACKGROUND

Field of Invention

The present invention relates to a photosensitive resin composition for a color filter of a liquid crystal display (LCD) and a color filter produced by using the same. More particularly, the present invention relates to a photosensitive resin composition for a color filter with excellent linearity of a finer pattern and resistance to an alkaline solution.

Description of Related Art

At present, a color filter has been widely used in the application fields of a color liquid crystal display (LCD), a color fax machine, a color video camera and the like. With the increasing market requirements of office equipments such as the color LCD and the like, the method of producing the color filter is tended to be diverse, and methods such as a dyeing method, a printing method, an electrodeposition method, a dispersing method and the like have been developed. Now, the dispersing method is the major technique for producing the color filter.

In the aforementioned dispersing method, the pigment is dispersed in the photosensitive resin composition. Then, the photosensitive resin is coated on a glass substrate, followed by being exposed, developed and obtaining a specific pattern. Next, the aforementioned coating, exposing, and developing steps are repeated in three times, resulting in the desired red (R), green (G) and blue (B) pixel color patterns in the pixel color layer of the color filter. Typically, for further improving the contrast of the color filter, a light-shielding layer (or called a black matrix) is disposed between the pixel color layers that are formed by pixels.

In the process of the dispersing method, examples for the alkali-soluble resin of the photosensitive resin composition can be a copolymer polymerized by (meth)acrylic acid as a monomer component. The aforementioned photosensitive resin composition can be referred to related references of Japanese Patent Laid-Open Publications JP H06-95211, JP H08-183819, JP H09-311210 and so on.

However, with minimization and lightweight of a personal digital assistant and a digital camera in recent years, the color filter must be much thinner and higher color saturation. Thus, it's needed to increase the concentration of the colorant of the photosensitive resin composition. When the concentration of the colorant is increased, the amount of the resin in the photosensitive resin is reduced relatively. When the amount of the adhesive resin is reduced, the adhesives between the pixel and the shielding layer is reduced and the pixel is easily peeled off, resulting in destructing the linearity of the finer pattern.

Japanese Patent Laid-Open Publication No. 2001-075273 discloses a photosensitive resin composition. The polymer, which is copolymerized by a unsaturated monomer having a carboxylic group and a monomer having an epoxy group, serves as the alkali-soluble resin of the photosensitive resin, for improving the aforementioned problems of the linearity of the finer pattern. However, such photosensitive resin composition has defects of bad resistance to an alkaline solution.

Therefore, there is a need to improve the problems of the bad linearity of the finer pattern of the photosensitive resin and the bad resistance to an alkaline solution simultaneously, which are also the issues being solved urgently by the skilled person in this art, so as to meet the requirements of the industry field.

SUMMARY

Therefore, an aspect of the present invention provides a photosensitive resin composition for a color filter. The photosensitive resin composition can increase the linearity of the finer pattern and the resistance to an alkaline solution.

Another aspect of the present invention provides a method of producing the color filter, which comprises a pixel layer formed by a photosensitive resin composition for the color filter.

A further aspect of the present invention provides a color filter produced by the aforementioned producing method.

A still further aspect of the present invention provides a liquid crystal display (LCD) comprising the aforementioned color filter.

According to the aforementioned aspects, a photosensitive resin composition for a color filter is provided, which includes an alkali-soluble resin (A), a compound having a vinyl unsaturated group (B), a photo-initiator (C), an organic solvent (D) and a pigment (E), all of which is described in details as follows.

Photosensitive Resin Composition for Color Filter

Alkali-Soluble Resin (A)

The alkali-soluble resin of the present invention is copolymerized by a vinyl unsaturated monomer having a carboxylic group (a1), a vinyl unsaturated monomer having a silane group (a2), a vinyl unsaturated monomer having an oxetanyl group (a3) and other copolymerizable vinyl unsaturated monomer (a4) that is excluded from the vinyl unsaturated monomer having the carboxylic group (a1), the vinyl unsaturated monomer having the silane group (a2) and the vinyl unsaturated monomer having the oxetanyl group (a3).

Vinyl Unsaturated Monomer Having Carboxylic Group (a1)

The examples of the vinyl unsaturated monomer having the carboxylic group (a1) includes an unsaturated monocarboxylic acid compound such as acrylic acid, methacrylic acid (MAA), crotonic acid, α-chloroacrylic acid, ethylacrylic acid, cinnamic acid, 2-acryloylethoxy succinate monoester, 2-methacryloyloxyethyl succinate monoester (HOMS) and the like; an unsaturated dicarboxylic acid (anhydride) compound such as maleic acid, maleic anhydride, fumaric acid, itaconic acid, itaconic anhydride, citraconic acid, citraconic anhydride and the like; and an unsaturated polycarboxylic acid (anhydride) having three or more carboxylic acid groups. The vinyl unsaturated monomer having the carboxylic group (a1) can be used alone or in a combination two or more.

Preferably, the vinyl unsaturated monomer having the carboxylic group (a1) can be acrylic acid, methacrylic acid, 2-acryloylethoxy succinate monoester, 2-methacryloylethoxy succinate monoester or any combination thereof.

Based on a total amount of the vinyl unsaturated monomer having the carboxylic group (a1), the following vinyl unsaturated monomer having the silane group (a2), the vinyl unsaturated monomer having the oxetanyl group (a3) and the other copolymerizable vinyl unsaturated monomer (a4) as 100 parts by weight, an amount of the vinyl unsaturated monomer having the carboxylic group (a1) is 15 parts by weight to 55 parts by weight, preferably 18 parts by weight to 52 parts by weight, and more preferably 20 parts by weight to 50 parts by weight.

Vinyl Unsaturated Monomer Having Silane Group (a2)

The vinyl unsaturated monomer having the silane group (a2) in the present invention can include a structure listed as Formula (I) or the like:

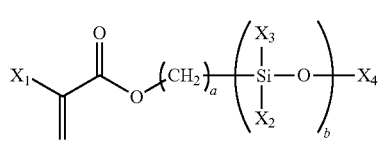

Formula (I)

in the Formula (I), the $X_1$ represents a hydrogen atom or a methyl group; the $X_2$ and the $X_3$ Individually and independently represent a phenyl group, an alkyl group of 1 to 12 carbon atoms, an alkoxy group of 1 to 6 carbon atoms or a group listed as Formula (II); the $X_4$ represents an alkyl group of 1 to 6 carbon atoms or a group listed as Formula (III); the a represents an integer of 1 to 6; the b represents an integer of 1 to 150; when the b is more than 1, a plurality of the $X_2$ can be the same or different from each other and a plurality of the $X_3$ can be the same or the different from each other.

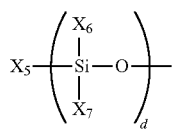

Formula (II)

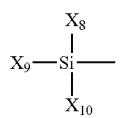

Formula (III)

in the Formula (II) and (III), the $X_5$, the $X_6$ and the $X_7$ individually and independently represent a phenyl group or an alkyl group of 1 to 12 carbon atoms; the d represents an integer of 2 to 13; when the d is more than 1, a plurality of the $X_6$ can be the same or different from each other and a plurality of the $X_7$ can be the same or the different from each other; the $X_8$, the $X_9$ and the $X_{10}$ individually and independently represent a phenyl group or an alkyl group of 1 to 12 carbon atoms.

The examples of the alkoxy group of 1 to 6 carbon atoms can be a methoxy group, an ethoxy group, a propoxy group or a butoxy group.

The examples of the alkyl group of 1 to 12 carbon atoms can be a methyl group, an ethyl group, a propyl group, a butyl group, a pentyl group, a hexyl group, a heptyl group, an octyl group, a nonyl group or a decyl group.

As listed in the Formula (I), the vinyl unsaturated monomer having the silane group can include but be not limited to allylsilane and methacrylic silanes, the examples of which can be 3-methacryloyloxypropyltrimethoxysilane (MPTMS), 3-methacryloyloxypropyitriethoxysilane (MPTES), 3-methacryloyloxypropylmethyldimethoxysilane, 3-methacryloyloxypropylmethyldiethoxysilane, and 3-acryloyloxypropyltrimethoxysilane, the compounds listed as Formulas (I-1) to (I-6) or the products of the trade name of FM-0711, 1FM-0721 or FM-0725 manufactured by Chisso Corporation:

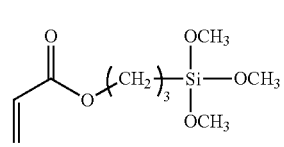

Formula (I-1)

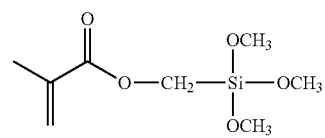

Formula (I-2)

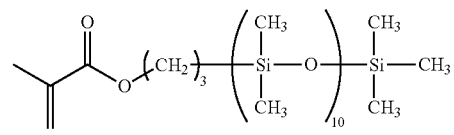

Formula (I-3)

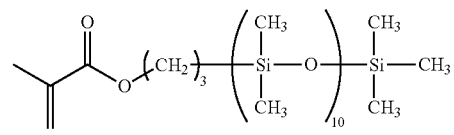

Formula (I-4)

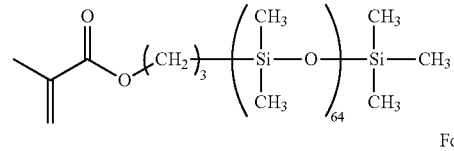

Formula (I-5)

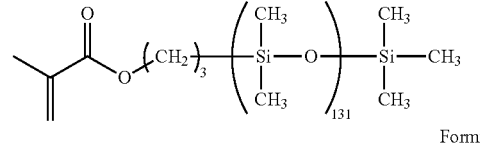

Formula (I-6)

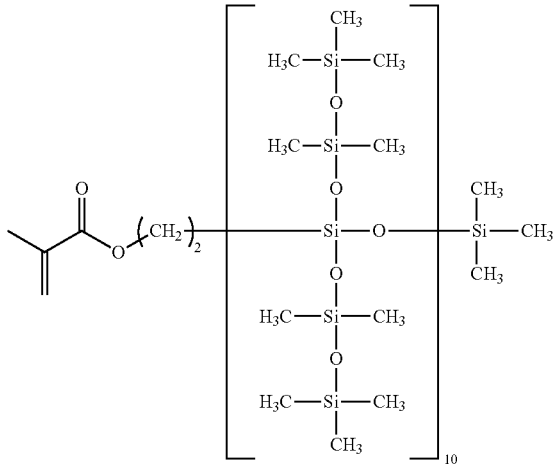

The aforementioned vinyl unsaturated monomer having the silane group (a2) can be used alone or in a combination of two or more.

Preferably, the vinyl unsaturated monomer having the silane group listed as Formula (I) can be 3-methacryloyloxypropyltrimethoxysilane (MPTMS), 3-methacryloyloxypropyltriethoxysilane (MPTES), the product of the trade name of FM-0711 manufactured by Chisso Corporation or any combination thereof.

The other vinyl unsaturated monomer having the silane group can include but be not limited to vinyltrimethoxysilane (VTMS), vinyltriethoxysilane (VTES), vinylmethyldimethoxysilane, vinylmethyldiethoxysilane, vinyldimethylmethoxysilane or vinyldimethylethoxysilane.

Based on the total amount of the vinyl unsaturated monomer having the carboxylic group (a1), the vinyl unsaturated monomer having the silane group (a2), the following vinyl unsaturated monomer having the oxetanyl group (a3) and the other copolymerizable vinyl unsaturated monomer (a4) as 100 parts by weight, an amount of the vinyl unsaturated monomer having the silane group (a2) is 1 part by weight to 15 parts by weight, preferably 1.5 parts by weight to 12 parts by weight, and more preferably 2 parts by weight to 10 parts by weight.

When the alkali soluble resin (A) does not include the vinyl unsaturated monomer having the silane group (a2) as the copolymerized monomer, the produced color filter has worse linearity of the finer pattern.

When the vinyl unsaturated monomer having the silane group (a2) includes the monomer having the structure listed as the Formula (I), the produced color filter has better linearity of the finer pattern.

Vinyl Unsaturated Monomer Having Oxetanyl Group (a3)

The vinyl unsaturated monomer having the oxetanyl group (a3) of the present invention includes a structure listed as Formula (IV) or the like:

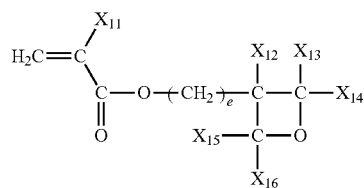

Formula (IV)

in the Formula (IV), the $X_{11}$ and the $X_{12}$ individually and independently represent a hydrogen atom or an alkyl group of 1 to 4 carbon atoms; the $X_{13}$, the $X_{14}$, the $X_{15}$ and the $X_{16}$ individually and independently represent a hydrogen atom, a fluoride atom, a phenyl group, an alkyl group of 1 to 4 carbon atoms or a perfluroalkyl group of 1 to 4 carbon atoms; and the e represents an integer of 1 to 6.

The examples of the unsaturated monomer listed as the Formula (IV) can include but be not limited to a methacrylate ester compound, an acrylate ester compound or an unsaturated monomer listed as Formulas (IV-1) to (IV-4).

The aforementioned methacrylate ester compound can include but be not limited to 3-(methacryloylmethoxy)oxetane (OXMA), 3-(methacryloyl methoxy)-3-ethyloxetane (EOXMA), 3-(methacryloylmethoxy)-3-methyloxetane, 3-(methacryloylmethoxy)-2-methyoxetane, 3-(methacryloylmethoxy)-2-trifluoromethyloxetane, 3-(methacryloylmethoxy)-2-pentafluoroethyloxetane, 3-(methacryloylmethoxy)-2-phenyloxetane, 3-(methacryloylmethoxy)-2,2-difluorooxetane, 3-(methacryloylmethoxy)-2,2,4-trifluorooxetane, 3-(methacryloylmethoxy)-2,2,4,4-tetrafluorooxetane, 3-(methacryloylethoxy)oxetane, 3-(methacryloylethoxy)-3-ethyloxetane, 2-ethyl-3-(methacryloylethoxy)oxetane, 3-(methacryloylethoxy)-2-trifluoromethyloxetane, 3-(methacryloylethoxy)-2-pentafluoroethyloxetane, 3-(methacryloylethoxy)-2-phenyloxetane, 2,2-difluoro-3-(methacryloylethoxy)oxetane, 3-(methacryloylethoxy)-2,2,4-trifluorooxetane, 3-(methacryloylethoxy)-2,2,4,4-tetrafluorooxetane or the like.

The aforementioned acrylate ester compound can include but be not limited to 3-(acryloylmethoxy)oxetane, 3-(acryloylmethoxy)-3-ethyloxetane, 3-(acryloylmethoxy)-3-methyloxetane, 3-(acryloylmethoxy)-2-methyloxetane, 3-(acryloylmethoxy)-2-trifluoromethyloxetane, 3-(acryloylmethoxy)-2-pentafluoroethyloxetane, 3-(acryloylmethoxy)-2-phenyloxetane, 3-(acryloylmethoxy)-2,2-difluorooxetane, 3-(acryloylmethoxy)-2,2,4-trifluorooxetane, 3-(acryloylmethoxy)-2,2,4,4-tetrafluorooxetane, 3-(acryloylethoxy)oxetane, 3-(acryloylethoxy)-3-ethyloxetane, 2-ethyl-3-(acryloylethoxy)oxetane, 3-(acryloylethoxy)-2 trifiuoromethyloxetane, 3-(acryloylethoxy)-2-pentafluoroethyloxetane, 3-(acryloylethoxy)-2-phenyloxetane, 2,2-difluoro-3-(acryloylethoxy)oxetane, 3-(acryloylethoxy) 2,2,4-trifluorooxetane, 3-(acryloylethoxy)-2,2,4,4-tetrafluorooxetane or the like.

The aforementioned unsaturated monomer is listed as Formulas (IV-1) to (IV-4):

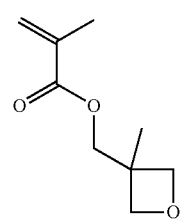

Formula (IV-1)

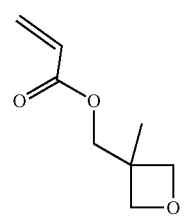

Formula (IV-2)

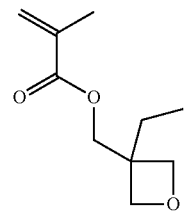

Formula (IV-3)

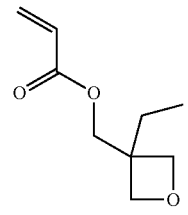

Formula (IV-4)

The other vinyl unsaturated monomer having the oxetanyl group can include but be not limited to 3-methyl-3-(vinylmethoxy)oxetane (MOXV), 3-ethyl-3-(vinylmethoxy)oxetane (EOXV), 3-propyl-3-(vinylmethoxy)oxetane, 3-methyl-3-(2-vinylethoxy)oxetane, 3-ethyl-3-(2-vinylethoxy) oxetane, 3-propyl-3-(2-vinylethoxy)oxetane, 3-methyl-3-(3-vinylpropoxy)oxetane, 3-ethyl-3-(3-vinylpropoxy)oxetane, 3-propyl-3-(3-vinylpropoxy)oxetane, 3-methyl-3-(3-vinylbutoxy)oxetane, 3-ethyl-3-(3-vinylbutoxy)oxetane, 3-propyl-3-(3-vinylbutoxy)oxetane, ethylene glycol[(3-ethyl-3-oxetanyl)methyl]vinyl ether, propylene glycol[(3-ethyl-3-oxetanyl)methyl]vinyl ether, 3,3-bis[(vinyloxy)methyl] oxetane or the like.

Based on the total amount of the vinyl unsaturated monomer having the carboxylic group (a1), the vinyl unsaturated monomer having the silane group (a2), the vinyl unsaturated monomer having the oxetanyl group (a3) and the following other copolymerizable vinyl unsaturated monomer (a4) as 100 parts by weight, an amount of the vinyl unsaturated monomer having the oxetanyl group (a3) is 3 parts by weight to 30 parts by weight, preferably 4 parts by weight to 25 parts by weight, and more preferably 5 parts by weight to 20 parts by weight.

When the alkali-soluble resin (A) does not include the vinyl unsaturated monomer having the oxetanyl group (a3) as the copolymerized monomer, the produced color filter has defects of bad resistance to an alkaline solution.

When the vinyl unsaturated monomer includes the monomer having the structure listed as the Formula (IV), the resistance to an alkaline solution of the produced color filter can be increased.

Other Copolymerizable Vinyl Unsaturated Monomer (a4)

The examples of the other copolymerizable vinyl unsaturated monomer (a4) of the present invention can include but be not limited to an aromatic vinyl compound such as dicyclopentyl acrylate, dicyclopentyl ethoxy acrylate, dicyclopentenyl acrylate (hereinafter as FA-511A), dicyclopentenylethoxy acrylate (hereinafter as FA-512A), dicyclopentyl methacrylate, dicyclopentyl ethoxy methacrylate, dicyclopentenyl methacrylate, dicyclopentenylethoxy methacrylate, styrene (SM), α-methyl styrene, vinyl toluene, p-chlorostyrene, methoxy styrene and the like; a maleimide compound such as N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide and the like; an unsaturated carboxylate ester compound such as methyl acrylate (MA), methyl methacrylate, benzyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, propylene acrylate, propylene methacrylate, benzyl acrylate, benzyl methacrylate (BzMA), phenyl acrylate, phenyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosyl methacrylate and the like; N,N-dimethyl amino ethyl acrylate, N,N-dimethyl amino ethyl methacrylate, N,N-diethyl amino propyl acrylate, N,N-diethyl amino propyl methacrylate, N,N-dibutyl amino propyl acrylate and N-isobutyl amino ethyl methacrylate; an unsaturated glycidyl carboxylate compound such as glycidyl acrylate, glycidyl methacrylate and the like; a vinyl carboxylate compound such as vinyl acetate, vinyl propionate, vinyl butyrate and the like; an unsaturated ether compound such as vinyl methyl ether, vinyl ethyl ether, allyl glycidyl ether, methallyl glycidyl ether and the like; a vinyl cyanide compound such as acrylonitrile, methacrylonitrile, α-chloroacrylonitrile, vinylidene cyanide and the like; an unsaturated amide compound such as acrylamide, methacrylamide, α-chloroacrylamide, N-hydroxyethyl acrylamide, N-hydroxyethyl methacrylamide and the like; an aliphatic conjugated diene compound such as 1,3-butadiene, isopentene, chlorobutadiene and the like, or a combination thereof. The aforementioned other copolymerizable vinyl unsaturated monomer (a4) can be used alone or in a combination of two or more.

Preferably, the other copolymerizable vinyl unsaturated monomer (a4) can include but be not limited to dicyclopentyl acrylate, dicyclopentyl ethoxyacrylate, dicyclopentenyl acrylate, dicyclopentenylethoxy acrylate, dicyclopentyl methacrylate, dicyclopentylethoxy methacrylate; dicyclopentenyl methacrylate; dicyclopentenylethoxy methacrylate, styrene, N-phenylmaleimide, methyl acrylate, methyl methacrylate, 2-hydroxyethyl acrylate, 2-hydroxyethyl methacrylate, benzyl acrylate, benzyl methacrylate or any combination thereof.

Based on the total amount of the aforementioned vinyl unsaturated monomer having the carboxylic group (a1), the vinyl unsaturated monomer having the silane group (a2), the vinyl unsaturated monomer having the oxetanyl group (a3) and the other copolymerizable vinyl unsaturated monomer (a4) as 100 parts by weight, an amount of the copolymerizable vinyl unsaturated monomer (a4) is 0 part by weight to 81 parts by weight, preferably 10 parts by weight to 70 parts by weight, and more preferably 20 parts by weight to 60 parts by weight.

Compound Having Vinyl Unsaturated Group (B)

The compound having the vinyl unsaturated group (B) of the present invention includes but is not limited to a first compound modified by an alkoxy group (B-1), a second compound modified by a caprolactone group (B-2), a third compound (B-3) that is excluded from the first compound modified by the alkoxy group (B-1) and the second compound modified by the caprolactone group (B-2) or any combination thereof.

First Compound Modified by Alkoxy Group (B-1)

The first compound modified by the alkoxy group (B-1) can include but be not limited to compounds listed as Formula (V), Formula (VI), Formula (VII) or any combination thereof.

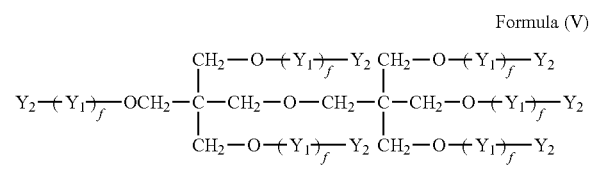

Formula (V)

-continued

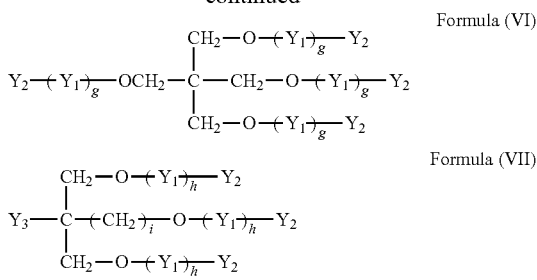

Formula (VI)

Formula (VII)

in the Formulas (V) to (VII), the $Y_1$ individually and independently represents $-(CH_2CH_2O-)$ or $-(CH_2CH(CH_3)O-)$; the $Y_2$ individually and independently represents an acryloyl group, a methacryloyl group or a hydrogen atom; the $Y_3$ individually and independently represents a hydrogen atom, an alkyl group of 1 to 6 carbon atoms or an aromatic group of 1 to 6 carbon atoms; and in the Formula (V), the total amount of the acryloyl group and methacryloyl group are 5 or 6; in the Formula (VI), the total amount of the acryloyl group and methacryloyl group are 3 or 4; in the Formula (VII), the total amount of the acryloyl group and methacryloyl group are 3; the f individually and independently represents an integer of 0 to 6 and the sum of the f is 3 to 24; the g individually and independently represents an integer of 0 to 6 and the sum of the g is 2 to 16; the h individually and independently represents an integer of 0 to 10 and the sum of the h is 3 to 30; and the I represents an integer of 0 to 3.

In the Formulas (V) to (VII), when the $Y_1$ represents $-(CH_2CH_2O-)$ or $-(CH_2CH(CH_3)O-)$, the $Y_1$ is preferably bound to the $Y_2$ via an oxygen atom.

In the Formula (V), the $Y_2$ is preferably an acryloyl group.

The compound listed as the Formula (V) or the Formula (VI) can be synthesized by the following steps. Firstly, through a ring-opening addition reaction performed by ethylene oxide or propylene oxide, pentaerythritol or dipentaerythritol are reacted and formed into a ring-opened backbone. Then, (meth)acryloyl chloride is reacted with a terminal hydroxyl group of the ring-opened backbone to form the (meth)acryloyl group.

The compounds listed as the Formulas (V) and (VI) are more preferably pentaerythritol derivatives, dipentaerythritol derivatives or a combination thereof.

The examples of the compound listed as the Formula (V) can include but be not limited to compounds listed as Formulas (V-1) to (V-3):

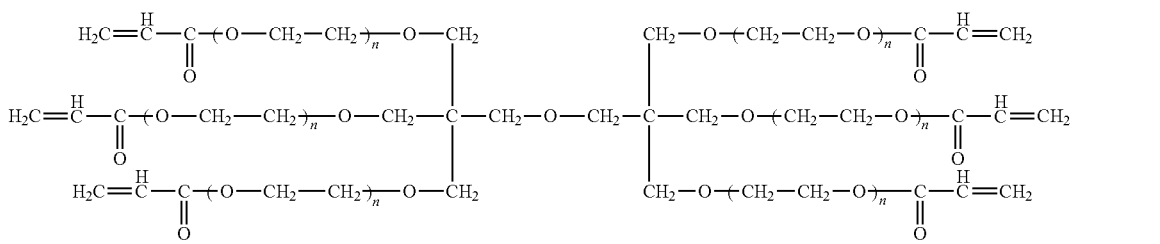

Formula (V-1)

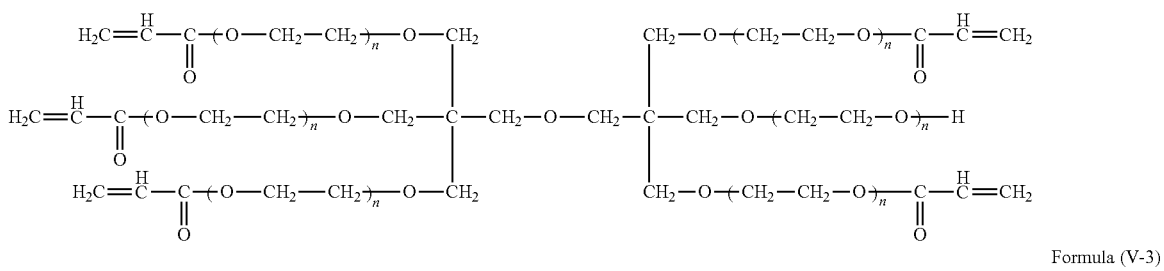

Formula (V-2)

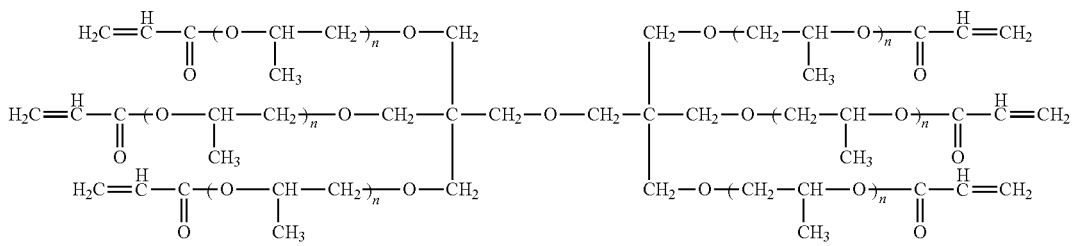

Formula (V-3)

in the Formula (V-1), the sum of the n can be 6 or 12. In the Formula (V-2), the sum of the n is 12. In the Formula (V-3), the sum of the n is 6.

Preferably, the compound listed as the Formula (V) can be the one listed as the Formula (V-1).

The examples of the compound listed as the Formula (VI) can include but be not limited to a compound listed as following Formula (VI-1), ethoxylated pentaerythritol tetraacrylate or propoxylated pentaerythritol tetraacrylate:

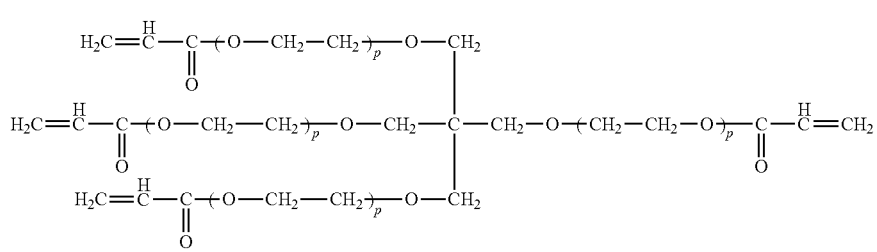

Formula (VI-1)

in the Formula (VI-1), the sum of the p can be 4 or 12.

The compound listed as the Formula (VI) can be commercial products, for example, the products of the trade name of EM2411 or EM2421 manufactured by Eternal Materials Co. Ltd. (Taiwan) or the products of the trade name of Miramer M4004 manufactured by Toyo Kagaku Co. Ltd. (Japan).

The examples of the aforementioned compound listed as the Formula (VII) can include but be not limited to ethoxylated trihydroxymethylpropyltriacrylate, ethoxylated trihydroxymethylpropyl trimethacrylate, propoxylated trihydroxymethylpropyl triacrylate or propoxylated glyceryl triacrylate.

The compound listed as the Formula (VII) can be commercial products, for example, the products of the trade names of KAYARAD GPO-303, KAYARAD THE-330, KAYARAD TPA-320 or KAYARAD TPA-330 manufactured by Nippon Kayaku Co. Ltd.; the products of the trade names of M-310, M-321, M-350, M-360 or M-460 manufactured by Toagosei Co. Ltd.; the products of the trade name of SR415, SR454, SR492, SR499, CD501, SR502, SR9020, SR9021 or SR9035 manufactured by Sartomer Co. Ltd.; products of the trade name of EM2380, EM2381, EM2382, EM2383, EM2384, EM2385, EM2386, EM2387 or EM3380 manufactured by Eternal Materials Co. Ltd.; products of the trade name of Miramer M3130, Miramer M3160, Miramer M3190 or Miramer M360 manufactured by Toyo Kagaku Co. Ltd. The aforementioned compounds can be used alone or in a combination two or more.

Based on a total amount of the alkali soluble resin (A) is 100 parts by weight, an amount of the first compound modified by the alkoxy group (B-1) is 20 parts by weight to 200 parts by weight, preferably 30 parts by weight to 160 parts by weight, more preferably 40 parts by weight to 120 parts by weight.

When the compound having the vinyl unsaturated group (B) includes the first compound modified by the alkoxy group (B-1), the produced color filter has good resistance to an alkaline solution.

Second Compound Modified by Caprolactone Group (B-2)

The second compound modified by the caprolactone group (B-2) can include a compound listed as Formula (VIII):

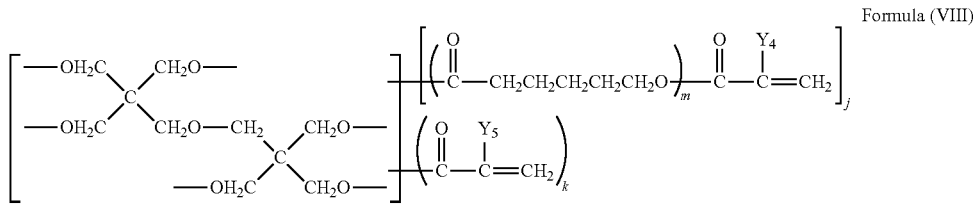

Formula (VIII)

in the Formula (VIII), the $Y_4$ and the $Y_5$ individually and independently represent a hydrogen group and a methyl group; the m represents an integer of 1 to 2; the j represents an integer of 1 to 6; the k represents an integer of 0 to 5; and the sum of the j and the k is 2 to 6.

The second compound modified by the caprolactone group (B-2) can be a (meth)acrylate compound that is obtained by a reaction between a polyol modified by the caprolactone group and (meth)acrylic acid.

The aforementioned polyol modified by the caprolactone group is formed by the reaction between caprolactone and a polyol with more than 4 functional groups. The aforementioned caprolactone can be γ-caprolactone, δ-caprolactone, ε-caprolactone or any combination thereof, and preferably ε-caprolactone.

The aforementioned polyol with more than 4 functional groups can be pentaerythritol, ditrimethylolpropane, dipentaerythritol or any combination thereof.

Based on an amount of the polyol with more than 4 functional groups is 1 mole, the amount of the aforementioned caprolactone preferably 1 mole to 12 moles.

The examples of the second compound modified by the caprolactone group (B-2) can include but be not limited a tetra(meth)acrylate compound modified by pentaerythritol, a tetra(meth)acrylate compound modified by ditrimethylolpropane, a poly(meth)acrylate compound modified by dipentaerythritol or a combination thereof.

The examples of the aforementioned poly(meth)acrylate compound modified by dipentaerythritol can be a di(meth)acrylate compound modified by dipentaerythritol, a tri (meth)acrylate compound modified by dipentaerythritol, a tetra(meth)acrylate compound modified by dipentaerythritol, a penta(meth)acrylate compound modified by dipentaerythritol, a hexa(meth)acrylate compound modified by dipentaerythritol or any combination thereof.

The second compound modified by the caprolactone group (B-2) can be products of the trade name of KAYARAD DPCA-20, KAYARAD DPCA-30, KAYARAD DPCA-60 or DPCA-120 manufactured by Nippon Kayaku Co. Ltd.

Based on the total amount of the alkali soluble resin (A) is 100 parts by weight, an amount of the second compound modified by the caprolactone group (B-2) is 6 parts by weight to 60 parts by weight, preferably 8 parts by weight to 50 parts by weight, and more preferably 10 parts by weight to 40 parts by weight.

When the compound having the vinyl unsaturated group (B) includes the second compound modified by the caprolactone group (B-2), the produced color filter has good linearity of the finer pattern.

Third Compound (B-3)

The third other compound has the functional group listed as Formula (IX):

Formula (IX)

in the Formula (IX), the $R_1$ represents a hydrogen atom or a methyl group.

The examples of the third compound can be acrylamide, (meth)acryloyl morpholine, (meth)acrylate-7-amino-3,7-dimethyloctyl ester, isobutoxy methyl (meth)acrylamide, isobornyl ethoxy (meth)acrylate, isobornyl (meth)acrylate, 2-ethyl-hexyl (meth)acrylate, ethyl diethylene glycol (meth)acrylate, tertoctyl (meth)acrylamide, diacetone (meth)acrylamide, dimethylamino (meth)acrylate, dodecyl (meth)acrylate, dicyclopentenyl ethoxy (meth)acrylate, dicyclopentenyl (meth)acrylate, N,N-dimethyl(meth)acrylamide, tetrachlorophenyl (meth)acrylate, 2-tetrachlorophenoxyl ethyl (meth)acrylate, tetrahydrofurfuryl (meth)acrylate, tetrabromophenyl (meth)acrylate, 2-tetrabromophenoxyethyl (meth)acrylate, 2-trichlorophenoxylethyl (meth)acrylate, tribromophenyl (meth)acrylate, 2-tribromophenoxylethyl (meth)acrylate, 2-hydroxyethyl (meth)acrylate, 2-hydroxypropyl (meth)acrylate, vinyl caprolactam, N-vinyl pyrrollidone, ethyl phenoxyl (meth)acrylate, pentachlorophenyl (meth)acrylate, pentabromophenyl (meth)acrylate, polyethylene glycol mono(meth)acrylate, polypropylene glycol mono(meth)acrylate, bronyl (meth)acrylate, ethylene glycol di(meth)acrylate, dicyclopentenyl di(meth)acrylate, triethylene glycol di(meth)acrylate, tetraethylene glycol di(meth)acrylate, tri(2-hydroxyethyl)isocyanate di(meth)acrylate, tri(2-hydroxyethyl)isocyanate tri(meth)acrylate, caprolactone modified tri(2-hydroxyethyl)isocyanate tri(meth)acrylate, trihydroxymethylolpropane tri(meth)acrylate, triethylene glycol di(meth)acrylate, neopropyl glycol di(meth)acrylate, 1,4-butylene glycol di(meth)acrylate, 1,6-hexadiol di(meth)acrylate, trihydroxymethylpropyl triacrylate, pentaerythritol tri(meth)acrylate, dipentaerythritol hexaacrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, di(trihydroxymethylpropane) tetra(meth)acrylate, ethylene glycol (hereinafter as EO) modified bisphenol A di(meth)acrylate, propylene glycol (hereinafter as PO) modified bisphenol A di(meth)acrylate, EO modified hydrobisphenol A di(meth)acrylate, PO modified hydrobisphenol A di(meth)acrylate, EO modified bisphenol F di(meth)acrylate, novolac polyglycidyl ether (meth)acrylate, or any combination thereof.

Preferably, the third compound (B-3) can be trihydroxymethylpropane triacrylate, pentaerythritol triacrylate, pentaerythritol tetraacrylate, dipentaerythritol hexaacrylate, dipentaerythritol pentaacrylate, dipentaerythritol tetraacrylate, di(trihydroxmethylpropane) tetraacrylate, products of the trade name of TO-1382 manufactured by Toagosei Co. Ltd. (Japan) or any combination thereof.

Based on the total amount of the alkali soluble resin (A) is 100 parts by weight, an amount of the compound having the vinyl unsaturated group (B) is 30 parts by weight to 300 parts by weight, preferably 40 parts by weight to 250 parts by weight, and more preferably 50 parts by weight to 200 parts by weight.

Photo-Initiator (C)

The photo-initiator (C) of the present invention can be an O-acyl oxime photo-initiator, a triazine photo-initiator, an acetophenone compound, a biimidazole compound or a benzophenone compound.

The examples of the O-acyl oxime photo-initiator can include 1-[4-(phenyl thio)phenyl]-heptane-1,2-dione-2-(O-benzoyl oxime), 1-[4-(phenyl thio)phenyl]-octane-1,2-dione-2-(O-benzoyl oxime), 1-[4-(benzoyl)phenyl]-heptane-1,2-dione-2-(O-benzoyl oxime), 1-[9-ethyl-6-(2-methylbenzoyl)-9H-carbazol-3-yl]-ethanone-1-(O-acetyl oxime), 1-[9-ethyl-6-(3-methylbenzoyl)-9H-carbazol-3-yl]-ethanone-1-(O-acetyl oxime), 1-[9-ethyl-6-benzoyl-9H-carbazol-3-yl]-ethanone-1-(O-acetyl oxime), ethanone-1-[9-ethyl-6-(2-methyl-4-tetrahydrofuran benzoyl)-9H-carbazol-3-yl]-1-(O-acetyl oxime), ethanone-1-[9-ethyl-6-(2-methyl-4-tetrahydropyran benzoyl)-9H-carbazol-3-yl]-1-(O-acetyl oxime), ethanone-1-[9-ethyl-6-(2-methyl-5-tetrahydrofuran benzoyl)-9H-carbazol-3-yl]-1-(O-acetyl oxime), ethanone-1-[9-ethyl-6-(2-methyl-5-tetrahydropyran benzoyl)-9H-carbazol-3-yl]-1-(O-acetyl oxime), ethanone-1-[9-ethyl-8-(2-methyl-4-tetrahydrofuran methoxy benzoyl)-9H-carbazol-3-yl]-1-(O-acetyl oxime), ethanone-1-[9-ethyl-6-(2-methyl-4-tetrahydropyran methoxy benzoyl)-9H-carbazol-3-yl]-1-(O-acetyl oxime), ethanone-1-[9-ethyl-6-(2-methyl-5-tetrahydrofuran methoxy benzoyl)-9H-carbazol-3-yl]-1-(O-acetyl oxime), ethanone-1-[9-ethyl-6-(2-methyl-5-tetrahydropyran methoxy benzoyl)-9H-carbazol-3-yl]-1-(O-acetyl oxime), ethanone-1-[9-ethyl-8-[2-methyl-4-(2,2-dimethyl-1,3-dioxygen heterocyclopentanyl)benzoyl]-9H-carbazol-3-yl]-1-(O-acetyl oxime), ethanone-1-[9-ethyl-6-[2-methyl-4-(2,2-dimethyl-1,3-dioxygen heterocyclopentanyl)methoxy benzoyl]-9H-carbazol-3-yl]-1-(O-acetyl oxime) or any combination thereof.

The examples of the triazine photo-initiator can include 2,4-bis(trichloromethyl)-6-(p-methoxy)styryl-s-triazine, 2,4-bis(trichloromethyl)-6-(1-p-dimethylaminophenyl-1,3-buta dienyl)-s-triazine, 2-trichloromethyl-4-amino-6-(p-methoxy)styryl-s-triazine or any combination thereof.

The examples of the acetophenone compound can be p-dimethylamino acetophenone, α,α'-dimethoxy azoxy acetophenone, 2,2'-dimethyl-2-phenyl acetophenone, p-methoxy acetophenone, 2-methyl-1-(4-methyl thio phenyl)-2-morpholino-1-acetone, 2-benzyl-2-N,N-dimethylamine-1-(4-morpholinophenyl)-1-butanone or any combination thereof.

The examples of the biimidazole compound can include 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenylbiimidazole, 2,2'-bis(2,4-dichlorophenyl)-4,4',5,5'-tetraphenylbiimidazole or any combination thereof.

The examples of the benzophenone compound can include thiaxanthone, 2,4-diethyl thiaxanthone, thiaxanthon-4-sulfone, benzophenone, 4,4'-bis(dimethylamine)benzophenone, 4,4'-bis(diethylamine)benzophenone or any combination thereof.

The aforementioned compounds can be used alone or in a combination two or more.

Preferably, the photo-initiator (C) can be 1-[4-(phenyl thio)phenyl]-octane-1,2-dione-2-(O-benzoyl oxime), 1-[9-ethyl-6-(2-methylbenzoyl)-9H-carbazol-3-yl]-ethanone-1-(O-acetyl oxime), ethanone-1-[9-ethyl-6-(2-methyl-4-tetrahydrofuran methoxy benzoyl)-9H-carbazol-3-yl]-1-(O-acetyl oxime), ethanone-1-[9-ethyl-6-[2-methyl-4-(2,2-dimethyl-1,3-dioxygen heterocyclopentanyl)methoxy benzoyl]-9H-carbazol-3-yl]-1-(O-acetyl oxime), 2,4-bis(trichloromethyl)-6-(p-methoxy)styryl-s-triazine, 2-benzyl-2-N,N-dimethylamine-1-(4-morpholino phenyl)-1-butanone, 2,2'-bis(2,4-dichlorophenyl)-4,4',5,5'-tetraphenyl-1,2'-biimidazole, 4,4'-bis(diethylamine)benzophenone or any combination thereof.

Based on the total amount of the alkali-soluble resin (A) as 100 parts by weight, an amount of the photo initiator (C) is 10 parts by weight to 150 parts by weight, preferably 15 parts by weight to 120 parts by weight, and more preferably 20 parts by weight to 100 parts by weight.

Organic Solvent (D)

The organic solvent (D) can dissolve the aforementioned alkali-soluble resin (A), the compound having the vinyl unsaturated group (B), the photo-initiator (C), and the following pigment (E). Moreover, the organic solvent (D) does not react with the aforementioned compounds and has a suitable volatility.

The examples of the organic solvent (D) can include (poly) alkylidene glycol monoalkyl ether such as ethylene glycol methyl ether, ethylene glycol ethyl ether, diethylene glycol methyl ether, diethylene glycol ethyl ether, diethylene glycol isopropyl ether, diethylene glycol isobutyl ether, triethylene glycol methyl ether, triethylene glycol ethyl ether, propylene glycol methyl ether, propylene glycol ethyl ether, dipropylene glycol monomethyl ether, dipropylene glycol monoethyl ether, dipropylene glycol n-propyl ether, dipropylene glycol n-butyl ether, tripropylene glycol methyl ether, tripropylene glycol ethyl ether and the like; (poly) alkylidene glycol monoalkyl ether acetate such as ethylene glycol methyl ether acetate, ethylene glycol ethyl ether acetate, propylene glycol methyl ether acetate, propylene glycol ethyl ether acetate and the like; other ether solvent such as diethylene glycol dimethyl ether, diethylene glycol methyl ethyl ether, diethylene glycol diethyl ether, tetrahydrofuran and the like; ketone solvent such as methylethyl ketone, cyclohexanone, 2-pentayl ketone, 3-pentayl ketone and the like; alkyl lactate such as 2-hydroxymethyl propionate, 2-hydroxyethyl propionate and the like; other ester solvent such as 2-hydroxy-2-methyl methyl propionate, 2-hydroxy-2-methyl ethyl propionate, 3-methoxy methyl propionate, 3-methoxy ethyl propionate, 3-ethoxy methyl propionate, ethyl 3-ethoxypropionate (EEP), ethoxy ethyl acetate, hydroxyethyl acetate, 2-hydroxy-3-methyl methyl butyrate, 3-methyl-3-methoxy butyl acetate, 3-methyl-3-methoxy butyl propionate, ethyl acetate, n-propyl acetate, isopropyl acetate, n-butyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, 2-methoxy ethyl butyrate and the like; aromatic hydrocarbon compound such as toluene, xylene and the like; carboxylic acid amide solvent such as N-methyl-2-pyrrolidone, N,N-dimethyl methyl amide, N,N-dimethyl ethyl amide and the like.

The aforementioned organic solvent can be used alone or in a combination of two or more.

Preferably, the organic solvent (D) can be propylene glycol methyl ether acetate or ethyl 3-ethoxypropionate.

Based on the total amount of the alkali-soluble resin (A) as 100 parts by weight, an amount of the organic solvent (D) is 500 parts by weight to 5000 parts by weight, preferably 1000 parts by weight to 4500 parts by weight, and more preferably 1500 parts by weight to 4000 parts by weight.

Pigment (E)

The pigment (E) of the present invention can be an inorganic pigment, an organic pigment or a combination thereof.

The inorganic pigment can be a metal compound such as a metal oxide or a metal complex salt, examples of which can include the metal oxides of iron, cobalt, aluminum, cadmium, lead, copper, titanium, magnesium, chromium, zinc or antimony, as well as composite oxides of those metals The examples of the organic pigment can include a C.I. yellow pigment 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175; C.I. orange pigment 1, 5, 13, 14, 16, 17, 24, 34, 36, 38, 40, 43, 46, 49, 51, 61, 63, 64, 71, 73; C.I. red pigment 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 193, 194, 202, 206, 207, 208, 209, 215, 216, 220, 224, 226, 242, 243, 245, 254, 255, 264, 265; C.I. purple pigment 1, 19, 23, 29, 32, 36, 38, 39; C.I. blue pigment 1, 2, 15, 15:3, 15:4, 15:6, 16, 22, 60, 66; C.I. green pigment 7, 36, 37; C.I. brown pigment 23, 25, 28; C.I. black pigment 1, 7 and the like. The pigment (E) can be used alone or in a combination of two or more.

The average particle size of the pigment (E) is typically 10 nm to 200 nm, preferably 20 nm to 150 nm, and more preferably 30 nm to 130 nm.

Depending on the demands, the pigment (E) of the present invention can selectively use a dispersion agent such as a cationic surfactant, an anionic surfactant, a non-ionic surfactant, a zwitterions surfactant, a polysiloxane surfactant and a fluorosurfactant.

The examples of the surfactant includes polyethylene oxide alkyl ether such as polyethylene oxide lauryl ether, polyethylene oxide stearyl ether, polyethylene oxide oleyl ether and the like; polyethylene oxide alkylphenyl ether surfactant such as polyethylene oxide octyl phenyl ether, polyethylene oxide nonyl phenyl ether and the like; polyethylene glycol diester such as polyethylene glycol bislaurate, polyoxyethylene stearate and the like; sorbitan fatty acid ester; fatty acid modified polyester; tertiary amines modified polyurethane; a product of the trade name of KP manufactured by Shin-Etsu Chemical Co. Ltd.; a product of the trade name of SF-8427 manufactured by Toray Dow Corning Silicon Co. Ltd.; a product of the trade name of Polyflow manufactured by Kyoeisha Chemical Co. Ltd.; a product of the trade name of F-Top manufactured by Tochem Products Co. Ltd.; a product of the trade name of Megafac manufactured by Dainippon Ink and Chemicals Co. Ltd.; a product of the trade name of Fluorade manufactured by Sumitomo 3M Co. Ltd.; a product of and the trade name of Asahi Guard or Surflon manufactured by Asahi Glass Co. Ltd.

Based on the total amount of the alkali-soluble resin (A) as 100 parts by weight, an amount of the pigment (E) is 60 parts by weight to 600 parts by weight, preferably 80 parts by weight to 500 parts by weight, more preferably is 100 parts by weight to 400 parts by weight.

Additive (F)

The photosensitive resin composition can selectively include an additive (F) without affecting the efficiency of the present invention. The examples of the additive (F) can include a filling agent, a polymer compound except for the alkali-soluble resin (A), an adhesion promoter, an antioxidant, an ultraviolet absorber, and an anti-focculant.

The examples of the filling agent can include glass, aluminum or the like.

The examples of the polymer can include polyvinyl alcohol, polyethylene glycol monoalkyl ether, polyfluoro alkyl acrylate or any combination thereof.

The examples of the adhesion promoter can include vinyl trimethoxy silane, vinyl triethoxy silane, vinyl tri(2-methoxyethoxy)silane, N-(2-aminoethyl)-3-aminopropylmethyl dimethoxysilane, N-(2-aminoethyl)-3-aminopropyl trimethoxysilane, 3-aminopropyl triethoxysilane, 3-glycidolpropyl trimethoxysilane, 3-glycidolpropyl methyldimethoxysilane, 2-(3,4-epoxycyclohexyl)ethyl trimethylsilane, 3-chloropropyl methyldimethoxysilane, 3-chloropropyl trimethoxysilane, 3-methyl allyloxy propyl trimethoxysilane, 3-sulfanol propyl trimethoxysilane or any combination thereof.

The examples of the antioxidant can include 2,2-thio bis(4-methyl-6-tertbutylphenol), 2,6-di-tertbutylphenol or any combination thereof.

The examples of the ultraviolet absorber can include 2-(3-tertbutyl-5-methyl-2-hydroxyphenyl)-5-chlorophenylazide, alkoxy phenone or any combination thereof.

The examples of the anti-focculant can include polyacrylate sodium and the like.

Based on the total amount of the alkali-soluble resin (A) as 100 parts by weight, an amount of the additive (F) is 0 parts by weight to 5 parts by weight, and preferably 0.1 parts by weight to 4 parts by weight, and more preferably 0.5 parts by weight to 3 parts by weight.

Preparation of Photosensitive Resin Composition for Color Filter

In general, the photosensitive resin composition of the present invention is prepared by mixing the aforementioned alkali-soluble resin (A), the compound having the vinyl unsaturated group (B), the photo initiator (C), the organic solvent (D) and the pigment (E) in a conventional mixer uniformly until all compositions are formed into a solution state, optionally adding the additive (F) thereto if necessary.

Method of Producing Color Filter

The present invention also provides a method of producing a color filter, which uses the aforementioned photosensitive resin composition of the color filter to form a pixel layer, hereinafter as a pixel color layer.

The present invention also provides a color filter, which is produced by the aforementioned producing method.

The method of producing the color filter sequentially includes a step of producing a photosensitive layer formed by the photosensitive resin composition of the color filter, a step of exposing the photosensitive layer to cure an exposed area, a step of removing a unexposed area with an alkaline developing solution to form the pattern, a step of recurring the pattern to form a pixel color layer, a step of sputtering an ITO protective film and so on.

In the aforementioned step of producing a photosensitive layer, the aforementioned solution state of the photosensitive resin composition can be coated on a substrate by various coating methods such as spin-coating, cast coating, roll coating or the like.

The aforementioned substrate can be alkali-free glass, Na—Ca glass, hard glass (Pyrex glass), a quartz glass, those having an electrically conductive transparent film disposed thereon or a substrate (for example, silicone substrate) used in light-to-electricity conversion (for example, solid-camera device).

In addition, before the photosensitive resin composition is coated on the substrate, the black matrix for separating the pixel color layer of red, green, blue and the like has been formed on the substrate.

After the coating process, most organic solvent in the photosensitive resin composition is removed by the drying process under reduced pressure. Then, the remaining organic solvent can be completely removed by the pre-baking process so as to form a pre-baked and coated film.

The drying process under reduced pressure is carried out in various conditions. Typically, the drying process under reduced pressure is performed under 0 to 200 torr for 1 to 60 seconds depending upon the kinds and the mixing ratio of the compounds. The pre-baking process is typically performed under 70° C. to 110° C. for 1 to 15 minutes.

In the aforementioned exposure step, the pre-baked and coated film is exposed under a mask having specific patterns. The exposure light is preferably UV light such as g-line, h-line, i-line and so on, which may be generated by a UV illumination device such as (super) high-pressure mercury lamp or metal halide lamp.

In the aforementioned step of developing, the pre-baked and coated film is immersed in a developing solution under 21° C. to 25° C. for 15 seconds to 5 minutes, thereby remove undesired portions of the exposed pre-baked and coated film and forming a semi-finished product having a pixel color layer with a given pattern.

The aforementioned developing solution can be alkaline solution such as sodium hydroxide, potassium hydroxide, sodium carbonate, sodium bicarbonate, potassium carbonate, potassium bicarbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, 1,8-diazabicyclo-[5,4,0]-7-undecene or the like.

The concentration of the developing solution is 0.001 weight percent (wt. %) to 10 wt. %, preferably 0.005 wt. % to 5 wt. %, and more preferably 0.01 wt. % to 1 wt. %.

In the aforementioned recurring step, the substrate (having the semi-finished product of the pixel color layer having the given pattern disposed thereon) is washed by water to remove undesired portions of the exposed, pre-baked and coated film. The semi-finished product having the pixel color layer with the given pattern is dried by using compressed air or nitrogen gas. Then, the semi-finished product having the pixel color layer with the given pattern is subjected to a post-bake treatment with a heating device such as a hot plate or an oven. The post-bake treatment can be carried out under 150° C. to 250° C. for 5 to 60 minutes on the hot plate or for 15 to 150 minutes in the oven, thereby curing the semi-finished product having the pixel color layer with the given pattern and forming a pixel color layer.

The pixel color layers of red, green, blue and the like can be formed sequentially on the substrate by repeating the aforementioned steps.

In the aforementioned step of sputtering the ITO protective film, the ITO protective film is sputtered on the surface of the pixel color layer under 220° C. to 250° C. under vacuum environment. The ITO protective film is etched and wired if necessary, and then a liquid crystal (LC) alignment film is coated on the surface of the ITO protective film so as to produce the color filter with the pixel layer.

Method of Producing Liquid Crystal Display

The present invention also provides a LCD, which includes the aforementioned color filter.

The color fitter and a substrate that has thin film transistor (TFT) are oppositely disposed. A cell gap is firstly interposed between the aforementioned two substrates. Next, the surrounding of the color filter and the substrate is sealed by an adhesive, and a gap-hole is left. Then, liquid crystal (LC) is injected from the gap-hole into a space defined by a surface of the substrate and the adhesive, and the gap-hole is sealed to form a LC layer. And then, a polarized plate is adhered on a side that does not contact the LC layer of the color filter and on another side that does not contact the LC layer of the substrate, so as to fabricate the LCD device.

The aforementioned LC can be a LC compound or a LC composition without specific limitations.

Moreover, the alignment film of the color filter is used to control the alignment of the LC molecule. The alignment film can be inorganic compounds or organic compounds without specific limitations to the aforementioned examples in the present invention.

Hereinafter, several embodiments are described below to illustrate the application of the present invention. However, these embodiments are not used for limiting the present invention. For those skilled in the art of the present invention, various variations and modifications can be made without departing from the spirit and scope of the present invention.

DETAILED DESCRIPTION

Preparation of Photosensitive Alkali-Soluble Resin (A)

Hereinafter, the alkali-soluble resins of Synthesis Examples A-1 to A-14 were prepared according to Table 1.

Synthesis Example A-1

A 1000 ml four-necked conical flask equipped with a nitrogen inlet, a stirrer, a heater, a condenser and a thermometer was purged with nitrogen. Then, 45 parts by weight of 2-methacryloyethoxy succinate monoester (hereinafter as HOMS), 1 part by weight of 3-methacryloxypropylt-rimethoxysilane (hereinafter as MPTMS), 3 parts by weight of 3-(methacryloyl methoxy)oxetane (hereinafter as OXMA), 11 parts by weight of dicyclopentenyl acrylate (hereinafter as FA-511A), 20 parts by weight of styrene monomer (hereinafter as SM), 5 parts by weight of benzyl methacrylate (hereinafter as BzMA) and 15 parts by weight of methyl methacrylate (hereinafter as MMA) were dissolved in 200 parts by weight of ethyl 3-ethoxypropionate (hereinafter as EEP), and the aforementioned monomers were fed continuously.

After mixed uniformly, the temperature of the oil bath was elevated to 100° C. Then, 4 parts by weight of 2,2'-azobis-2-methyl butyronitrile (AMBN) was dissolved in ethyl 3-ethoxypropionate (EEP), and the solution containing AMBN was separated to five equal parts. One of the five parts was added into the four-necked conical flask every one hour.

The reaction temperature of the polymerization process was kept 100° C., and the polymerization time was continued for 6 hrs. After the polymerization process, the polymerized product was obtained from the four-necked conical flask and the solvent was devolatilized so as to produce the alkali-soluble resin (A-1).

Synthesis Examples A-2 to A-14

Synthesis Examples A-2 to A-14 were synthesized with the same method as in Synthesis Example A-1 by using various kinds, amounts of the reactants or the conditions of polymerization for the alkali-soluble resin (A). The formulations of Synthesis Examples A-2 to A-14 were listed in Table 1 rather than focusing or mentioning them in details.

Preparation of Photosensitive Resin Composition

The photosensitive resin compositions of Examples 1 to 12 and Comparative Examples 1 to 8 were prepared according to Table 2 and Table 3 as follows.

Example 1

100 parts by weight of the alkali-soluble resin (A-1), 20 parts by weight of the first compound modified by the alkoxy group (in which n is 6 and hereinafter as B-1-1), 10 parts by weight of dipentaerythritol hexaacrylate (hereinafter as B-3-1), 3 parts by weight of 2-methyl-1-(4-methylthio phenyl)-2-morpholino-1-propanone (hereinafter as C-1), 3 parts by weight of 2,2'-bis(2,4-dichlorophenyl)-4,4',5,5'-tetraphenyl-biimidazole (hereinafter as C-2), 4 parts by weight of 4,4'-bis(diethylamine) benzophenone (hereinafter as C-3), 60 parts by weight of C. I. Pigment R254/C. I. Pigment Y139=80/20 (hereinafter as E-1), and 0.1 parts by weight of 2,2-thio bis(4-methyl-6-tertbutylphenol) (hereinafter as F-2) were added into 500 parts by weight of ethyl 3-ethoxypropionate (hereinafter as D-1). The aforementioned components were mixed in a shaking type stirrer uniformly, so as to produce the photosensitive resin composition of the example 1. The resulted photosensitive resin composition was evaluated according to the following evaluation methods, and the result thereof was listed as Table 2. The evaluation methods of the resistance to an alkaline solution and the linearity of the finer pattern were described as follows.

Examples 2 to 12 and Comparative Examples 1 to 8

Examples 2 to 12 and comparative examples 1 to 8 were practiced with the same method as in Example 1 by using various kinds or amounts of the components for the photosensitive resin composition. The formulations and evaluation results thereof were listed in Table 2 and Table 3 rather than focusing or mentioning them in details
Evaluation Methods
1. Resistance to Alkaline Solution The photosensitive resin composition of the examples 1 to 12 and comparative examples 1 to 8 were coated on glass substrates, and the size of the glass substrate was 100 mm×100 mm. Next, a reduced-pressure drying was subjected to the glass substrate for 30 seconds under 100 mmHg. Then, the aforementioned glass substrate was pre-baked for 2 minutes at 80° C. to form a pre-baked and coated film with 2.5 μm in thickness.

Next, the pre-baked and coated film was exposed to 100 mJ/cm$^2$ UV light (the trade name of the exposing device was Canon PLA-501F). Then, the film was baked at 235° C. for 30 minutes, so as to form a photosensitive resin layer of 2.0 μm in thickness on the glass substrate.

The chromaticity (L*, a*, b*) of the photosensitive resin layer was measured by the chromaticity meter manufactured by Otsuka Electronics Co. Ltd. (the trade name was MPCD). Thereafter, the film was immersed an alkaline solution (potassium hydroxide, and the concentration is 0.5 wt. %) under 23° C. for 60 minutes, and the chromaticity was measured again. A chromaticity difference (ΔEab*) was calculated according to the following Formula (X), and an evaluation was made according to the following criterion.

$$\Delta Eab^* = [(\Delta L)^2 + (\Delta a)^2 + (\Delta b)^2]^{1/2} \quad (X)$$

: ΔEab*<1
◎: 1≤ΔEab*<2
○: 2≤ΔEab*<4
▲: 4≤ΔEab*<6
X: 6≤ΔEab*

Linearity of the Finer Pattern

The photosensitive resin composition of the examples 1 to 12 and comparative examples 1 to 8 were coated on glass substrates, and the size of the glass substrate was 100 mm×100 mm. Next, a reduced-pressure drying is subjected to the glass substrate for 30 seconds under 100 mmHg. Then, the aforementioned glass substrate was pre-baked for 2 minutes at 80° C. to form a pre-baked and coated film with 2.5 μm in thickness.

Next, the pre-baked and coated film was exposed to 100 mJ/cm$^2$ UV light (the trade name of the exposing device was Canon PLA-501F) through a mask with a strip-shaped pattern of 25 μm in width (the pitch of 50 μm). Then, the pre-baked and coated film was immersed in a developing solution under 23° C. for 2 minutes and was washed by water. And then the pre-baked and coated film was post-baked under 200° C. for 80 minutes so as to form a photosensitive resin layer of 2.0 μm in thickness on the glass substrate.

Next, the strip-shaped pattern on the photosensitive resin layer was observed by an optical microscope. Based on a total amount of the strip-shaped pattern was 100%, a percentage (P) of the good linearity of the strip-shaped pattern was then calculated and evaluated according to the following criterion:

: 95%≤P
◎: 90%≤P<95%
○: 80%≤P<90%
▲: 70%≤P<80%
X: P≤70%

According to the results of Table 2 and Table 3, when the aforementioned alkali-soluble resin (A) included the structure of the vinyl unsaturated monomer having the silane group (a2) listed as the Formula (I), the produced photosensitive resin composition had good linearity of the finer pattern.

Moreover, when the alkali-soluble resin (A) included the structure of the vinyl unsaturated monomer having the oxetanyl group listed as the Formula (IV), the produced photosensitive resin had good resistance to an alkaline solution.

In addition, when the compound having the vinyl unsaturated group (B) included the first compound modified by the alkoxy group (B-1), the produced photosensitive resin composition had good resistance to an alkaline solution. When the compound having the vinyl unsaturated group (B) included the second compound modified by the caprolactone group, the produced photosensitive resin had good linearity of the finer pattern.

It should be supplemented that, although specific compounds, components, specific reactive conditions, specific processes, specific evaluation methods or specific equipments are employed as exemplary embodiments of the present invention, for illustrating the photosensitive resin composition and the application of the same of the present invention. However, as is understood by a person skilled in the art instead of limiting to the aforementioned examples, the photosensitive resin composition and the application of the same of the present invention also can be manufactured by using other compounds, components, reactive conditions, processes, analysis methods and equipment without departing from the spirit and scope of the present invention.

Although the present invention has been described in considerable detail with reference to certain embodiments thereof, other embodiments are possible. Therefore, the spirit and scope of the appended claims should not be limited to the description of the embodiments contained herein.

TABLE 1

| | Composition (parts by weight) | | | | | | | | | | | |
|---|---|---|---|---|---|---|---|---|---|---|---|---|
| | Monomer for copolymerization | | | | | | | | | | | |
| | a1 | | | a2 | | | | a3 | | | | a4 | |
| | HOMS | MAA | AA | MPTMS | MPTES | VTMS | VTES | OXMA | EOXMA | MOXV | EOXV | FA-511A | FA-512A |
| A-1 | 45 | | | 1 | | | | 3 | | | | 11 | |
| A-2 | | 20 | | | 3 | | | | 5 | | | | 32 |
| A-3 | 20 | | 20 | 5 | | | | | 15 | | | | |
| A-4 | 55 | | | 1 | | | | 10 | 10 | | | 10 | |
| A-5 | | 15 | | | | 9 | | | 25 | | | | 25 |
| A-6 | 50 | | | | | | 11 | 30 | | | | | |
| A-7 | | 35 | | 12 | | | | | | | 25 | 3 | |

TABLE 1-continued

| | | | | | | | | | | | |
|---|---|---|---|---|---|---|---|---|---|---|---|
| A-8 | | 30 | 5 | 10 | | | | | 30 | | 15 |
| A-9 | 40 | | | | | 10 | | 20 | | 15 | |
| A-10 | | 30 | | | | | | 20 | | | 20 |
| A-11 | | | 20 | 5 | | | | | | | 25 |
| A-12 | 40 | | | | 10 | | | | | | |
| A-13 | | 35 | | | | | | | | | |
| A-14 | | | 30 | | | | | | | 35 | |

| | Composition (parts by weight) | | | | | | | Polymerized parameter | | |
|---|---|---|---|---|---|---|---|---|---|---|
| | Monomer for copolymerization | | | | | | | | Reacting | |
| | a4 | | | | Initiator | | Solvent | Method of | temperature | Polymerized |
| | SM | BzMA | MMA | GMA | AMBN | ADVN | EEP | adding monoer | (C.) | time (hour) |
| A-1 | 20 | 5 | 15 | | 4 | | 200 | Continuously fed | 100 | 6 |
| A-2 | | 40 | | | 4.5 | | 200 | one-time fed | 105 | 6 |
| A-3 | 20 | | 20 | | 4 | | 200 | Continuously fed | 100 | 5.5 |
| A-4 | | 8 | | | | 4 | 200 | one-time fed | 105 | 6 |
| A-5 | | 10 | 16 | | 4 | | 200 | Continuously fed | 100 | 6 |
| A-6 | 4 | 5 | | | 4.5 | | 200 | one-time fed | 105 | 6 |
| A-7 | 10 | | 10 | 5 | 4 | | 200 | Continuously fed | 100 | 5.5 |
| A-8 | | 10 | | | | 4 | 200 | one-time fed | 105 | 6 |
| A-9 | 20 | 5 | 10 | | 4 | | 200 | Continuously fed | 100 | 6 |
| A-10 | | 30 | | | 4.5 | | 200 | one-time fed | 105 | 6 |
| A-11 | | 30 | 20 | | 4 | | 200 | Continuously fed | 100 | 6 |
| A-12 | 25 | 10 | | 15 | 4.5 | | 200 | one-time fed | 105 | 6 |
| A-13 | 35 | | 30 | | 4 | | 200 | Continuously fed | 100 | 5.5 |
| A-14 | | | 35 | | 4 | | 200 | one-time fed | 105 | 6 |

HOMS 2-methacryloyloxyehtyl succinate monoester
MAA methacrylic acid
AA acrylic acid
MPTMS 3-methylacryloyloxypropyltrimethoxysilane
MPTES 3-methylacryloyloxypropyltriethoxysilane
VTMS vinyltrimethoxysilane
VTES vinyltriethoxysilane
OXMA 3-(methacryloylmethoxy)oxetane
EOXMA 3-(methacryloyl methoxy)-3-ethyloxetane
MOXV 3-methyl-3-(vinyloxy)oxetane
EOXV 3-ethyl-3-(vinyloxy)oxetane
FA-511A dicyclopenteny acrylate
FA-512A dicyclopentenyloxyethyl acrylate
SM styrene monomer
BzMA benzyl methacrylate
MMA methyl methacrylate
GMA glycidyl methacrylate
AMBN 2,2'-azobis-2-methyl butyronitrile
ADVN 2,2'-azobis(2,4-dimethylvaleronitrile)
EEP ethyl 3-ethoxypropionate

TABLE 2

| | | Examples | | | | | | | | | | | |
|---|---|---|---|---|---|---|---|---|---|---|---|---|---|
| Composition | | 1 | 2 | 3 | 4 | 5 | 6 | 7 | 8 | 9 | 10 | 11 | 12 |
| Alkali-soluble | A-1 | 100 | | | | | | | | 70 | | | |
| resin (A) | A-2 | | 100 | | | | | | | | 50 | | |
| (parts by weight) | A-3 | | | 100 | | | | | | | | 30 | |
| | A-4 | | | | 100 | | | | | | | | 10 |
| | A-5 | | | | | 100 | | | | | | | |

TABLE 2-continued

| Composition | | | 1 | 2 | 3 | 4 | 5 | 6 | 7 | 8 | 9 | 10 | 11 | 12 |
|---|---|---|---|---|---|---|---|---|---|---|---|---|---|---|
| | | A-6 | | | | | | 100 | | | | | | |
| | | A-7 | | | | | | | 100 | | 30 | | | |
| | | A-8 | | | | | | | | 100 | | | | |
| | | A-9 | | | | | | | | | | 50 | | |
| | | A-10 | | | | | | | | | | | | |
| | | A-11 | | | | | | | | | | | 70 | |
| | | A-12 | | | | | | | | | | | | |
| | | A-13 | | | | | | | | | | | | 90 |
| | | A-14 | | | | | | | | | | | | |
| Compound having an unsaturated vinyl group (B) (parts by weight) | B-1 | B-1-1 | 20 | | | | | | | | | 60 | | |
| | | B-1-2 | | 40 | | | | | | | | 60 | 150 | |
| | | B-1-3 | | | | | | | | 100 | | | | 200 |
| | B-2 | B-2-1 | | | 50 | | | | | | | 40 | | |
| | | B-2-2 | | | | 6 | | | | | | | 30 | |
| | | B-2-3 | | | | | | 60 | | | | | 20 | 60 |
| | B-3 | B-3-1 | 10 | | | | | | 150 | | | | | |
| | | B-3-2 | | | | 50 | | | | | | | | |
| | | B-3-3 | | | | | 100 | | | | 200 | | | 40 |
| Photo-initiator (C) (parts by weight) | | C-1 | 3 | 10 | | 20 | 30 | | 30 | 50 | | 50 | 80 | 90 |
| | | C-2 | 3 | 20 | 30 | 20 | 30 | 40 | 30 | 50 | 30 | 70 | | |
| | | C-3 | 4 | | | | | 40 | | | 50 | | 25 | 30 |
| | | C-4 | | | 20 | 10 | | 30 | 60 | | 50 | | 25 | 30 |
| Organic solvent (D) (parts by weight) | | D-1 | 500 | | 1500 | 1000 | 500 | 2000 | 1500 | 1000 | 3000 | 4500 | 4000 | 5000 |
| | | D-2 | | 1000 | | 1000 | | | 1500 | 2500 | 1000 | | 1000 | |
| Pigment(E) (parts by weight) | | E-1 | 60 | | | | 60 | | | | 240 | | | |
| | | E-2 | | 80 | | | | 120 | | | | 320 | | |
| | | E-3 | | | 100 | | | | 140 | | | | 400 | |
| | | E-4 | | | | 200 | | | | 200 | | | | 600 |
| Additive(F) (parts by weight) | | F-1 | | | | | | 1 | | | | | | |
| | | F-2 | 0.1 | | | | | | | | | | | 5 |
| | | F-3 | | | | | | | | | | | | |
| | | F-4 | | | | | | | | | | | | |
| Evalutaiton method | | Alkali resistance | # | # | ◎ | ◎ | ◎ | ◎ | ○ | ◎ | ◎ | # | # | # |
| | | Linearity of the finer pattern | ◎ | ◎ | # | # | ○ | ◎ | ◎ | ◎ | ◎ | # | # | # |

TABLE 3

| Composition | | | Comparative Examples | | | | | | | |
|---|---|---|---|---|---|---|---|---|---|---|
| | | | 1 | 2 | 3 | 4 | 5 | 6 | 7 | 8 |
| Alkali-soluble resin (A) (parts by weight) | | A-1 | | | | | | | | |
| | | A-2 | | | | | | | | |
| | | A-3 | | | | | | | | |
| | | A-4 | | | | | | | | |
| | | A-5 | | | | | | | | |
| | | A-6 | | | | | | | | |
| | | A-7 | | | | | | | | |
| | | A-8 | | | | | | | | |
| | | A-9 | 100 | | | | | 30 | | |
| | | A-10 | | 100 | | | | | 70 | |
| | | A-11 | | | 100 | | | 70 | | |
| | | A-12 | | | | 100 | | | 30 | |
| | | A-13 | | | | | 100 | | | |
| | | A-14 | | | | | | 100 | | |
| Compound having an unsaturated vinyl group (B) (parts by weight) | B-1 | B-1-1 | | | | | | 50 | | |
| | | B-1-2 | | | | | | | | |
| | | B-1-3 | | | | | | | | |
| | B-2 | B-2-1 | | | | | | | 100 | |
| | | B-2-2 | | | | | | | | |
| | | B-2-3 | | | | | | | | |
| | B-3 | B-3-1 | 100 | | | 100 | | | 100 | |
| | | B-3-2 | | 200 | | | 200 | | | 100 |
| | | B-3-3 | | | 300 | | | 300 | | |
| Photo-initiator (C) (parts by weight) | | C-1 | | 50 | 80 | 90 | | 50 | 80 | 90 |
| | | C-2 | 20 | 70 | | | 15 | 70 | | |
| | | C-3 | 15 | | 25 | 30 | 20 | | 25 | 30 |
| | | C-4 | 25 | | 25 | 30 | 25 | | 25 | 30 |

TABLE 3-continued

|  | Composition | Comparative Examples | | | | | | | |
|---|---|---|---|---|---|---|---|---|---|
|  |  | 1 | 2 | 3 | 4 | 5 | 6 | 7 | 8 |
| Organic solvent (D) | D-1 | 2000 | 2500 | 2000 | 2500 | 2000 | 2500 | 2000 | 2500 |
| (parts by weight) | D-2 |  |  | 1000 | 1500 |  |  | 1000 | 1500 |
| Pigment(E) | E-1 | 120 |  |  |  | 120 |  |  |  |
| (parts by weight) | E-2 |  | 240 |  |  |  | 240 |  |  |
|  | E-3 |  |  | 260 |  |  |  | 260 |  |
|  | E-4 |  |  |  | 300 |  |  |  | 300 |
| Additive(F) | F-1 |  |  |  |  |  |  |  |  |
| (parts by weight) | F-2 |  |  |  |  |  |  |  |  |
|  | F-3 |  |  |  |  |  |  | 20 |  |
|  | F-4 |  |  |  |  | 10 |  |  |  |
| Evalutaiton method | Alkali resistance | ▲ | ▲ | X | X | X | X | ▲ | ▲ |
|  | Linearity of the finer pattern | X | X | ▲ | ▲ | X | X | ▲ | ▲ |

B-1-1 first compound in the Formula (V-1), in which n is 6.
B-1-2 first compound in the Formula (V-3)
B-1-3 Miramer M4004(made by TOYO KAGAKU Co. Ltd.)
B-2-1 DPCA-120(made by Nippon Kayaku Co. Ltd.)
B-2-2 DPCA-60(made by Nippon Kayaku Co. Ltd.)
B-2-3 DPCA-30(made by Nippon Kayaku Co. Ltd.)
B-3-1 dipentaerythritol hexaacrylate
B-3-2 trimethylolpropane triacrylate
B-3-3 di(trimethylolpropane) tetraacrylate
C-1 2-methyl-1-(4-methyl thiol phenyl)-2-morpholine-1-acetone
C-2 2,2'-bis(2,4-dichlorophenyl)-4,4',5,5'-tetraphenyl biimidazole
C-3 4,4'-bis(diethylamine) benzophenone
C-4 1-[4-(phenyl thio)phenyl]-octane-1,2-dione-2-(O-benzoyl oxime)
D-1 ethyl 3-ethoxypropionate
D-2 propylene glycol methyl ether acetate
E-1 C.I. Pigment R254/C.I. Pigment Y139 = 80/20
E-2 C.I. Pigment G36/C.I. Pigment Y150 = 60/40
E-3 C.I. Pigment B15:6
E-4 C.I. Pigment BK7
F-1 3-sulfanol propyl trimethoxysilane
F-2 2,2-thio bis(4-methyl-6-tertbutylphenol)
F-3 vinyltriethoxysilane
F-4 3-(methacryloylmethoxy)-3-methyloxetane

What is claimed is:

1. A photosensitive resin composition for a color filter, comprising:

an alkali-soluble resin (A);

a compound having a vinyl unsaturated group (B);

a photo-initiator (C);

an organic solvent (D); and a pigment (E), wherein the alkali-soluble resin (A) is copolymerized by a vinyl unsaturated monomer having a carboxylic group (a1), a vinyl unsaturated monomer having a silane group (a2), a vinyl unsaturated monomer having an oxetanyl group (a3) and an other copolymerizable vinyl unsaturated monomer (a4) that is excluded from the vinyl unsaturated monomer having the carboxylic group (a1), the vinyl unsaturated monomer having the silane group (a2) and the vinyl unsaturated monomer having the oxetanyl group (a3).

2. The photosensitive resin composition for the color filter of claim 1, wherein the vinyl unsaturated monomer having the silane group (a2) comprises an unsaturated monomer having a structure listed as Formula (I):

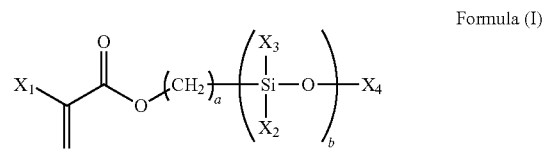

Formula (I)

in the Formula (I), the $X_1$ represents a hydrogen atom or a methyl group; the $X_2$ and the $X_3$ individually and independently represent a phenyl group, an alkyl group of 1 to 12 carbon atoms, an alkoxy group of 1 to 6 carbon atoms or a group listed as Formula (II); the $X_4$ represents an alkyl group of 1 to 6 carbon atoms or a group listed as Formula (III); the a represents an integer of 1 to 6; the b represents an integer of 1 to 150; when the b is more than 1, a plurality of the $X_2$ is the same or different from each other and a plurality of the $X_3$ is the same or the different from each other:

Formula (II)

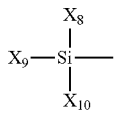

Formula (III)

in the Formula (II), the $X_5$, the $X_6$ and the $X_7$ individually and independently represent a phenyl group or an alkyl group of 1 to 12 carbon atoms; the d represents an integer of 2 to 13; when the d is more than 1, a plurality of the $X_6$ is the same or different from each other and a plurality of the $X_7$ is the same or the different from each other; and in the Formula (III), the $X_8$, the $X_9$ and the $X_{10}$ individually and independently represent a phenyl group or an alkyl group of 1 to 12 carbon atoms.

3. The photosensitive resin composition for the color filter of claim 1, wherein the vinyl unsaturated monomer having the oxetanyl group (a3) comprises an unsaturated monomer having a structure listed as Formula (IV):

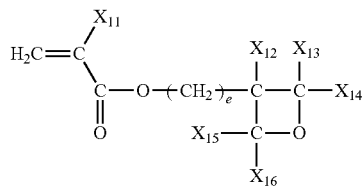

Formula(IV)

in the Formula (IV), the $X_{11}$ and the $X_{12}$ individually and independently represent a hydrogen atom or an alkyl group of 1 to 4 carbon atoms; the $X_{13}$, the $X_{14}$, the $X_{15}$ and the $X_{16}$ individually and independently represent a hydrogen atom, a fluoride atom, a phenyl group, an alkyl group of 1 to 4 carbon atoms or a perfluroalkyl group of 1 to 4 carbon atoms; and the e represents an integer of 1 to 6.

4. The photosensitive resin composition for the color filter of claim 1, wherein based on a total amount of the vinyl unsaturated monomer having the carboxylic group (a1), the vinyl unsaturated monomer having the silane group (a2), the vinyl unsaturated monomer having the oxetanyl group (a3) and the other copolymerizable vinyl unsaturated monomer (a4) that is excluded from the vinyl unsaturated monomer having the carboxylic group (a1), the vinyl unsaturated monomer having the silane group (a2) and the vinyl unsaturated monomer having the oxetanyl group (a3) as 100 parts by weight, an amount of the vinyl unsaturated monomer having the carboxylic group (a1) is 15 parts by weight to 55 parts by weight, an amount of the vinyl unsaturated monomer having the silane group (a2) is 1 part by weight to 15 parts by weight, an amount of the vinyl unsaturated monomer having the oxetanyl group (a3) is 3 parts of weight to 30 parts of weight and an amount of the other copolymerizable vinyl unsaturated monomer (a4) is 0 part of weight to 81 parts of weight.

5. The photosensitive resin composition for the color filter of claim 1, wherein the compound having the vinyl unsaturated group (B) comprises a first compound modified by an alkoxy group (B-1), a second compound modified by a caprolactone group (B-2) and a combination thereof.

6. The photosensitive resin composition for the color filter of claim 5, wherein the first compound modified by the alkoxy group (B-1) is selected from the compound listed as Formula (V), the compound listed as Formula (VI), the compound listed as Formula (VII) and any combination thereof:

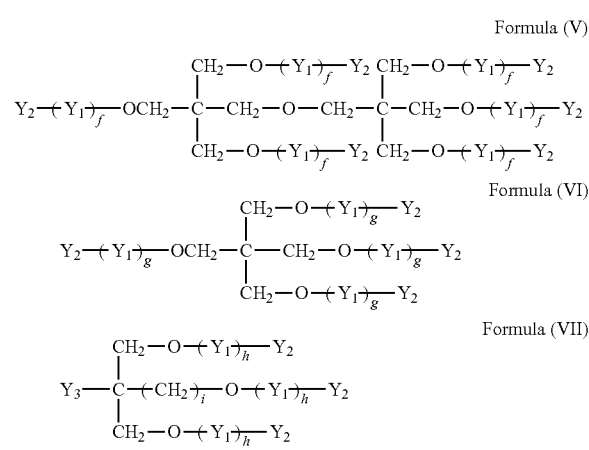

in the Formula (V) to (VII), the $Y_1$ individually and independently represents $-(CH_2CH_2O-)$ or $-(CH_2CH(CH_3)O-)$; the $Y_2$ individually and independently represents an acryloyl group, a methacryloyl group or a hydrogen atom; the Y3 individually and independently represents a hydrogen atom, an alkyl group of 1 to 6 carbon atoms or an aromatic group of 6 to 12 carbon atoms; and in the Formula (V), the amount of the acryloyl group and methacryloyl group are 5 or 6; in the Formula (VI), the amount of the acryloyl group and methacryloyl group are 3 or 4; in the Formula (VII), the amount of the acryloyl group and methacryloyl group are 3; the f individually and independently represents an integer of 0 to 6 and the sum of the f is 3 to 24; the g individually and independently represents an integer of 0 to 6 and the sum of the g is 2 to 16; the h individually and independently represents an integer of 0 to 10 and the sum of the h is 3 to 30; and the i represents an integer of 0 to 3.

7. The photosensitive resin composition for the color filter of claim 5, wherein the second compound modified by a caprolactone group (B-2) comprises the compound listed as Formula (VIII):

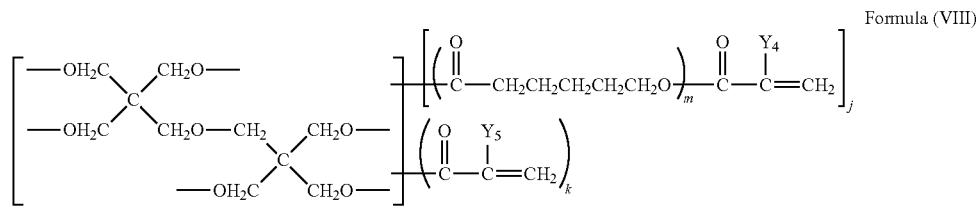

Formula (VIII)

in the Formula (VIII), the $Y_4$ and the $Y_5$ individually and independently represent a hydrogen group and a methyl group; the m represents an integer of 1 to 2; the j represents an integer of 1 to 6; the k represents an integer of 0 to 5; and the sum of the j and the k is 2 to 6.

8. The photosensitive resin composition for the color filter of claim 1, based on a total amount of the alkali-soluble resin (A) is 100 parts by weight, an amount of the compound having the vinyl unsaturated group (B) is 30 parts by weight to 300 parts by weight; an amount of the photo initiator (C) is 10 parts by weight to 150 parts by weight; an amount of the organic solvent is 500 parts by weight to 5000 parts by weight; and an amount of the pigment is 60 parts by weight to 600 parts by weight.

9. The photosensitive resin composition for the color filter of claim 5, wherein based on the total amount of the alkali-soluble resin (A) is 100 parts by weight, an amount of the first compound modified by the alkoxy group (B-1) is 20 parts by weight to 200 parts by weight; an amount of the second compound modified by the caprolactone group (B-2) is 6 parts by weight to 60 parts by weight.

10. A method of producing a color filter, wherein the method comprises:
    forming a pixel layer from by a photosensitive resin composition for the color filter, wherein the photosensitive resin composition for the color filter comprises:
    an alkali-soluble resin (A);
    a compound having a vinyl unsaturated group (B);
    a photo-initiator (C);
    an organic solvent (D); and a pigment (E),
    wherein the alkali-soluble resin (A) is copolymerized by a vinyl unsaturated monomer having a carboxylic group (a1), a vinyl unsaturated monomer having a silane group (a2), a vinyl unsaturated monomer having an oxetanyl group (a3) and an other copolymerizable vinyl unsaturated monomer (a4) that is excluded from the vinyl unsaturated monomer having the carboxylic group (a1), the vinyl unsaturated monomer having the silane group (a2) and the vinyl unsaturated monomer having the oxetanyl group (a3).

11. A color filter, comprising a pixel layer formed from a photosensitive resin composition for the color filter, wherein the photosensitive resin composition for the color filter comprises:
    an alkali-soluble resin (A);
    a compound having a vinyl unsaturated group (B);
    a photo-initiator (C);
    an organic solvent (D); and a pigment (E),
    wherein the alkali-soluble resin (A) is copolymerized by a vinyl unsaturated monomer having a carboxylic group (a1), a vinyl unsaturated monomer having a silane group (a2), a vinyl unsaturated monomer having an oxetanyl group (a3) and an other copolymerizable vinyl unsaturated monomer (a4) that is excluded from the vinyl unsaturated monomer having the carboxylic group (a1), the vinyl unsaturated monomer having the silane group (a2) and the vinyl unsaturated monomer having the oxetanyl group (a3).

12. A liquid crystal display device, comprising a color filter including a pixel layer formed from a photosensitive resin composition for the color filter, wherein the photosensitive resin composition for the color filter comprises:
    an alkali-soluble resin (A);
    a compound having a vinyl unsaturated group (B);
    a photo-initiator (C);
    an organic solvent (D); and a pigment (E),
    wherein the alkali-soluble resin (A) is copolymerized by a vinyl unsaturated monomer having a carboxylic group (a1), a vinyl unsaturated monomer having a silane group (a2), a vinyl unsaturated monomer having an oxetanyl group (a3) and an other copolymerizable vinyl unsaturated monomer (a4) that is excluded from the vinyl unsaturated monomer having the carboxylic group (a1), the vinyl unsaturated monomer having the silane group (a2) and the vinyl unsaturated monomer having the oxetanyl group (a3).

* * * * *